(12) United States Patent
Brandstrom

(10) Patent No.: US 7,525,306 B2
(45) Date of Patent: Apr. 28, 2009

(54) MAGNETIC ENCODER WITH SEPARATION OF SENSOR FROM THE ENVIRONMENT

(76) Inventor: Randel Brandstrom, 8713-53 Avenue, Edmonton, Alberta (CA) T6E 5E9

( * ) Notice: Subject to any disclaimer, the term of this patent is extended or adjusted under 35 U.S.C. 154(b) by 0 days.

(21) Appl. No.: 11/853,926

(22) Filed: Sep. 12, 2007

(65) Prior Publication Data

US 2009/0066319 A1    Mar. 12, 2009

(51) Int. Cl.
*G01B 7/14* (2006.01)
*G01R 33/06* (2006.01)

(52) U.S. Cl. .................. 324/207.15; 324/207.2

(58) Field of Classification Search ............ 324/207.11, 324/207.15, 207.2, 207.22, 207.13, 207.25, 324/174, 160–161, 163, 165, 345, 355; 338/32 R, 338/32 H; 73/514.39, 514.16, 514.31; 384/448, 384/446, 544, 537
See application file for complete search history.

(56) References Cited

U.S. PATENT DOCUMENTS

| | | | | |
|---|---|---|---|---|
| 4,988,220 A | * | 1/1991 | Christiansen et al. | ....... 384/448 |
| 5,032,790 A | * | 7/1991 | Johnson | ....................... 324/174 |
| 5,537,032 A | * | 7/1996 | Hurrell et al. | ................ 324/173 |
| 5,633,062 A | * | 5/1997 | Saito et al. | ...................... 428/68 |
| 5,969,518 A | * | 10/1999 | Merklein et al. | ............ 324/173 |
| 6,179,471 B1 | * | 1/2001 | Moretti et al. | ............... 384/448 |
| 6,605,938 B1 | * | 8/2003 | Sentoku et al. | .............. 324/174 |
| 6,911,817 B2 | * | 6/2005 | Clark | .......................... 324/174 |
| 7,170,280 B2 | * | 1/2007 | Lohberg | ................ 324/207.25 |

* cited by examiner

*Primary Examiner*—Reena Aurora
(74) *Attorney, Agent, or Firm*—Adrian D. Battison; Ade & Company Inc.

(57) ABSTRACT

A magnetic encoder for detecting for example movement of a continuous pipe, wire line, pipe joints, rod, etc. into a well includes a wheel in the contaminated environment of the well with a permanent magnet mounted on the wheel such that the magnet moves past a sensing location each time the wheel rotates to provide a count representative of the rotation of the wheel and thus if the forwarding distance of the tubing. A sensor responsive to presence of a field generated by the presence of the magnet is mounted in a cylinder defining a separate environment for the sensor inside the cylinder with a stainless steel end dividing wall separating the wheel from the sensor with a ferro-magnetic pin extending through the dividing wall such that the presence of the magnet at the sensing location causes actuation of the sensor.

9 Claims, 1 Drawing Sheet

MAGNETIC ENCODER WITH SEPARATION OF SENSOR FROM THE ENVIRONMENT

This invention relates to a magnetic encoder where a permanent magnet mounted on a rotating wheel is sensed each time it passes a sensor to generate a count representative of the rotation of the wheel.

BACKGROUND OF THE INVENTION

Many patents disclose magnetic encoders, in many cases related to automobile ABS systems, In all of these cases the sensors must be protected from the environment. Generally the sensors are separated from the wheel by a sheet of a plastics material.

U.S. Pat. No. 7,229,708 (Abe) issued Jun. 12, 2007 discloses a magnetic encoder using a stainless steel sheet and a resin laminated layer to provide water resistance.

SUMMARY OF THE INVENTION

It is one object of the invention to provide a magnetic encoder which can tolerate harsh environmental conditions such as those present in a well.

According to one aspect of the invention there is provided a magnetic encoder comprising:

a wheel rotatable about an axis for detecting motion in a contaminated environment;

at least one permanent magnet mounted on the wheel such that the magnet moves past a sensing location in the contaminated environment each time the wheel rotates to provide a count representative of the rotation of the wheel;

a sensor responsive to presence of a field generated by the presence of the magnet;

a dividing wall separating the wheel in the contaminated environment from the sensor in a separate environment, the dividing wall being formed of a material which is not ferromagnetic;

and a ferro-magnetic pin extending through the dividing wall from a first end of the pin at the sensing location in the contaminated environment at the magnet to a second end at the sensor in the separate environment, the ferro-magnetic pin being arranged such that the presence of the magnet at the sensing location causes actuation of the sensor.

Preferably the pin includes a portion projecting outwardly from the wall.

Preferably the pin is elongate.

Preferably the pin extends radially of the axis away from the wheel.

Preferably the first end of the pin lies alongside the magnet.

Preferably the wall is spaced outwardly from the wheel.

Preferably the wall is stainless steel or it can be any non-ferrous material.

Preferably the wall forms the end of a cylinder within which the sensor is located.

In one example of an end use, the wheel is arranged to engage an exterior of a tubing arranged to be fed into a well such that the contaminated environment includes higher pressure than the separate environment and includes contaminating materials. However the arrangement can be used in any harsh environment such as in the presence of high pressure or corrosive chemicals. Such environments commonly occur in the oil and gas industry and in the chemical engineering field. The encode can be used for detecting longitudinal movement of an elongate element such as a pipe or tube or it may be used for detecting a distance moved relative to any object regardless or its shape and dimension and regardless of a direction of movement.

BRIEF DESCRIPTION OF THE DRAWINGS

One embodiment of the invention will now be described in conjunction with the accompanying drawings in which.

In the drawings like characters of reference indicate corresponding parts in the different figures.

DETAILED DESCRIPTION

Figures 1, 2:
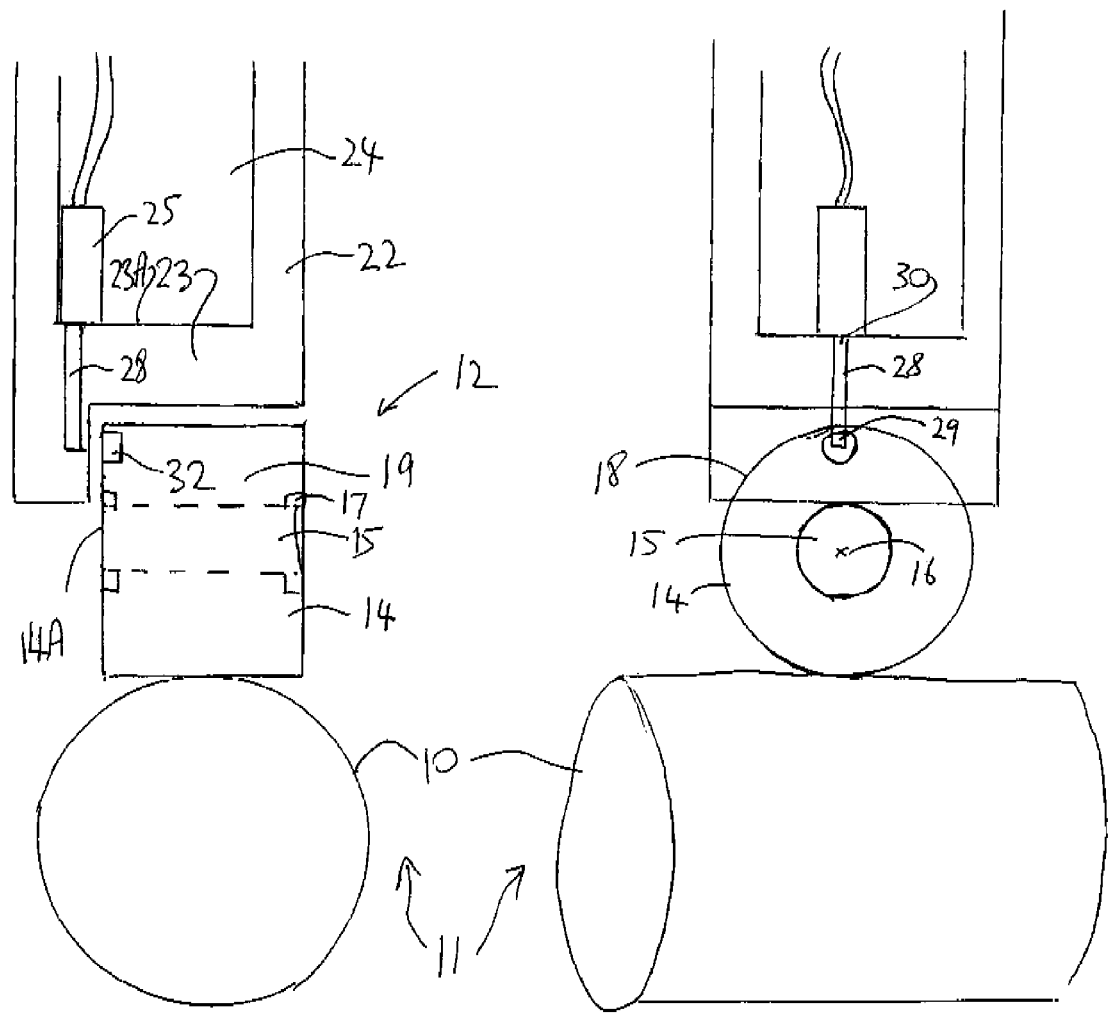
FIG. 1 is a transverse cross sectional view of a magnetic encoder for detecting movement of a length of an elongate object into a well.
FIG. 2 is a longitudinal cross sectional view of the magnetic encoder of FIG. 1.

The embodiment disclosed herein is shown relating to the detection of movement of an elongate material such as continuous pipe, wire line, pipe joints rod, etc. in an oil well or other down-hole environment. However the same arrangement of magnetic encoder can be used in other environments where it is desirable to separate the sensor from the wheel generating the magnetic impulses and from the element on which the wheel rolls.

Thus in FIG. 1 is shown a sensing system generally indicated at 10 in a down-hole environment generally indicated at 11 where the sensing system includes a housing 12. In that environment is provided the tubing 10 which is a continuous length of tubing fed from a supply which is fed into the well and is moved axially along the well to a required position. Thus it is necessary to detect the length of movement which has occurred of the tubing so as to detect the position of the components within the well.

The sensing system 10 comprises a wheel 14 carried on a shaft 15 for rotation around an axis 16 of the shaft. The wheel is carried on bearings 17 so an outer wall 18 of the wheel rolls along the tubing as the tubing moves along its axis. The outer wall 18 includes an outer surface 19 which is suitably configured and arranged to provide an effective and accurate rolling action. The shaft 15 is carried in a supporting projecting portion (not shown) of the housing which extends forwardly into the environment 11.

Within the housing 12 is provided a sealed cylinder 22 with an end wall 23 defining a hollow interior 24. Within the hollow interior is mounted a sensor 25 which is arranged to detect a magnetic field. The cylinder 22 is sealed from the environment 11 so as to define a separate environment within the closed interior 24 of the cylinder.

The magnetic sensing device may be for example a Hall Effect Sensor, inductive sensor or a Read Switch. Such devices are readily available from many manufacturers.

The sensor is located wholly within the hollow interior 24 so it is entirely separated from the environment 11. The sensor is positioned with an end face of the sensor butting against an inside surface 23A of the end wall 23. A ferromagnetic transfer pin 28 extends from a first end 29 alongside the wheel 14 to a second end 30 butting the face 23A of the end wall 23 and thus butting against the front face of the sensor 25. The pin extends radially away from the axis 16 so that the end wall 23 is located outwardly of the wheel face 19. The pin is arranged at a position slightly off-set from the wheel so that the pin extends to a position with its first end 29 alongside a face 14A of the wheel. On this face is mounted one or more fixed permanent magnets 32. As the magnet rotates with the wheel, therefore, the magnet passes the side-face of the pin at the end 29 of the pin 28 outwardly of the bearings 17. Thus each time the magnet passes the pin, the permanent magnetic field from the permanent magnet is transferred into the pin and through the pin to the sensor 25.

This arrangement allows the sensor 25 to detect each time the magnet rotates around the axis 16 without the sensor being located in the environment 11 and while the sensor is fully protected within the separate environment of the cylinder.

Since various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense.

The invention claimed is:

1. Apparatus comprising:
   a first element defining a contaminated environment containing a fluid under pressure;
   a second element movable within the contaminated environment;
   and a magnetic encoder for measuring movement of the second element within the contaminated environment, the magnetic encode comprising:
   a wheel rotatable about an axis in the contaminated environment, the wheel having an outer periphery arranged to roll on the second element to rotate the wheel as the second element moves in the contaminated environment;
   at least one permanent magnet mounted on the wheel such that the magnet moves past a sensing location in the contaminated environment each time the wheel rotates to provide a count representative of the rotation of the wheel;
   a sensor responsive to presence of a field generated by the presence of the magnet;
   a dividing wall separating the wheel in the contaminated environment from the sensor in a separate environment, the dividing wall being formed of a material which is not ferro-magnetic;
   the dividing wall being arranged to maintain the sensor in the separate environment separated from the fluid in the contaminated environment and separated from the pressure in the fluid in the contaminated environment;
   and a ferro-magnetic pin extending through the dividing wall from a first end of the pin at the sensing location in the contaminated environment at the magnet on the to a second end at the sensor in the separate environment, the ferro-magnetic pin being arranged such that the presence of the magnet at the sensing location causes actuation of the sensor.

2. The magnetic encoder according to claim 1 wherein the pin includes a portion projecting outwardly from the wall.

3. The magnetic encoder according to claim 1 wherein the pin is elongate.

4. The magnetic encoder according to claim 1 wherein the pin extends radially of the axis away from the wheel.

5. The magnetic encoder according to claim 1 wherein the first end of the pin lies alongside the magnet.

6. The magnetic encoder according to claim 1 wherein the wall is spaced outwardly from the wheel.

7. The magnetic encoder according to claim 1 wherein the wall is stainless steel.

8. The magnetic encoder according to claim 1 wherein the wall forms the end of a cylinder within which the sensor is located.

9. The magnetic encoder according to claim 1 wherein the wheel is arranged to engage an exterior of a tubing arranged to be fed into a well such that the contaminated environment includes higher pressure than the separate environment and includes contaminating materials.

* * * * *